United States Patent
Peng et al.

(10) Patent No.: US 9,252,049 B2
(45) Date of Patent: Feb. 2, 2016

(54) METHOD FOR FORMING INTERCONNECT STRUCTURE THAT AVOIDS VIA RECESS

(71) Applicant: Taiwan Semiconductor Manufacturing Company, Ltd., Hsin-Chu (TW)

(72) Inventors: Chao-Hsien Peng, Zhubei (TW); Tsung-Min Huang, Taichung (TW); Hsiang-Huan Lee, Jhudong Township (TW); Shau-Lin Shue, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/787,492

(22) Filed: Mar. 6, 2013

(65) Prior Publication Data

US 2014/0252618 A1 Sep. 11, 2014

(51) Int. Cl.
*H01L 23/48* (2006.01)
*H01L 21/768* (2006.01)
*H01L 23/532* (2006.01)

(52) U.S. Cl.
CPC .... *H01L 21/76849* (2013.01); *H01L 21/76867* (2013.01); *H01L 21/76885* (2013.01); *H01L 23/53238* (2013.01); *H01L 2924/0002* (2013.01)

(58) Field of Classification Search
CPC ............... H01L 21/76841; H01L 21/76843; H01L 21/76844; H01L 21/76846; H01L 21/76847; H01L 21/76849; H01L 21/76877; H01L 45/1683; H01L 2221/1015

USPC ......... 438/618–627, 631, 634, 638, 643, 656, 438/672, 687
See application file for complete search history.

(56) References Cited

U.S. PATENT DOCUMENTS

| | | | |
|---|---|---|---|
| 2004/0056366 A1* | 3/2004 | Maiz et al. | 257/779 |
| 2005/0148190 A1* | 7/2005 | Dubin et al. | 438/700 |
| 2007/0293049 A1* | 12/2007 | Minamihaba et al. | 438/692 |
| 2009/0212334 A1* | 8/2009 | Hong | 257/288 |
| 2009/0304914 A1* | 12/2009 | Nalla et al. | 427/124 |
| 2010/0130001 A1* | 5/2010 | Noguchi | 438/627 |
| 2012/0244698 A1* | 9/2012 | Ryan | 438/653 |

FOREIGN PATENT DOCUMENTS

WO    WO 2008084366 A1 *  7/2008

* cited by examiner

*Primary Examiner* — Brook Kebede
(74) *Attorney, Agent, or Firm* — Slater & Matsil, L.L.P.

(57) ABSTRACT

A method for forming an interconnect structure includes forming a dielectric material layer on a semiconductor substrate. The dielectric material layer is patterned to form a plurality of vias therein. A first metal layer is formed on the dielectric material layer, wherein the first metal layer fills the plurality of vias. The first metal layer is planarized so that the top thereof is co-planar with the top of the dielectric material layer to form a plurality of first metal features. A stop layer is formed on top of each of the plurality of first metal features, wherein the stop layer stops a subsequent etch from etching into the plurality of the first metal features.

14 Claims, 5 Drawing Sheets

METHOD FOR FORMING INTERCONNECT STRUCTURE THAT AVOIDS VIA RECESS

BACKGROUND

When fabricating semiconductor devices, for electrical connection between elements or lines, metal lines are used. In recent years, as semiconductor devices are required to have higher integration and higher performance, copper (Cu), having excellent electrical properties such as conductivity, is used as the material of choice to form the metal lines.

A copper metal line is not easy to pattern through an etching process, such as subtractive patterning process used to form aluminum metal lines, and so it is patterned through a damascene process. In a multi-line structure, a damascene process of forming a via connecting upper/lower lines and an upper metal line at the same time has widely been used.

FIG. 1 is a cross-sectional view of part of a simplified interconnect structure formed on a semiconductor device from the prior art. In the figure, a patterned dielectric layer 54 is formed on an upper surface of a semiconductor substrate 50. Formed between the openings of the patterned dielectric layer 54 are metal lines 55. A metal layer 56 made of copper, for instance is formed above the metal lines 55 and the patterned dielectric layer 54. In a later process, the metal layer will be etched to form metal vias above the lower metal lines 55. Though not shown in FIG. 1, a thin layer of barrier metal film may be deposited and formed on the inner walls of the metal lines 55 and/or metal vias. The barrier metal film functions to prevent copper atoms from diffusing into the dielectric layer 54 when metal lines and/or metal vias are formed. Also shown in FIG. 1 is a patterned photoresist layer 58 formed on metal layer 56 through a typical photolithography process. The photolithography process may comprise a series of processes, such as photoresist coating, exposure, and development.

The conventional copper metal line formation method can have a number of problems. One problem may be misalignment. In the process of device feature or pattern exposure, the alignment between successive layers that are being created is of critical importance. Smaller device dimensions place even more stringent requirements on the accuracy of the alignment of the successive layers that are superimposed on each other. In FIG. 2, following the etching of the metal layer 56 in which the patterned photoresist layer 58 is used as mask to form metal vias 60, via recesses VR may be formed at the juncture of a metal via 60 and a respective one of the lower metal line. Via recesses can be caused when the metal via 60 in contact with a respective one of the lower metal line are misaligned (e.g., shifted to one side) relative to the lower metal line. Such misalignment can result from a mask misalignment failure, for example, during the photolithography process. Due to this misalignment, the via recess formed can be a serious problem in the conventional copper etch approach by causing unstable yield and decreased device reliability.

BRIEF DESCRIPTION OF DRAWINGS

Embodiments of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

In the following description, specific details are set forth to provide a thorough understanding of embodiments of the present disclosure. However, one having ordinary skill in the art will recognize that embodiments of the disclosure can be practiced without these specific details. In some instances, well-known structures and processes are not described in detail to avoid unnecessarily obscuring embodiments of the present disclosure.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are intended for illustration.

Figure 1:
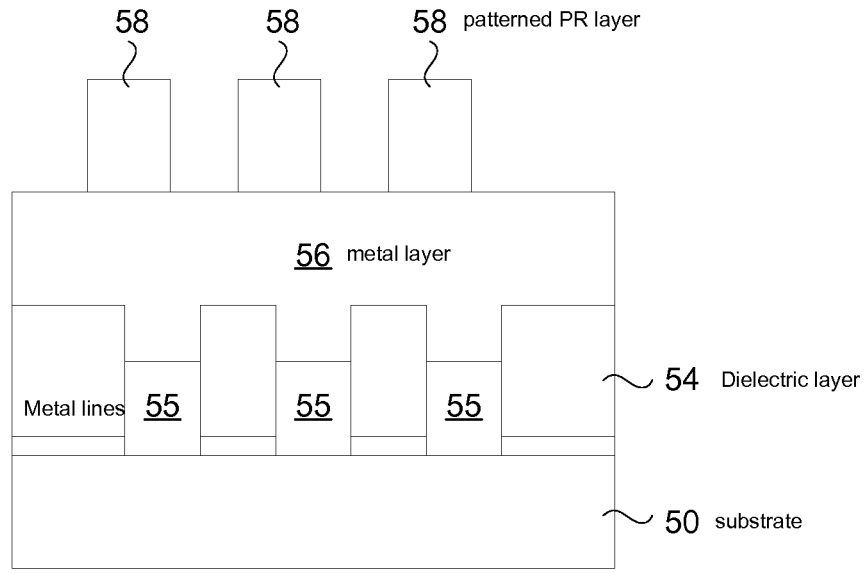
FIGS. 1 and 2 are cross-sectional views of a part of an interconnect structure of a semiconductor device from the prior art.
Figure 2:
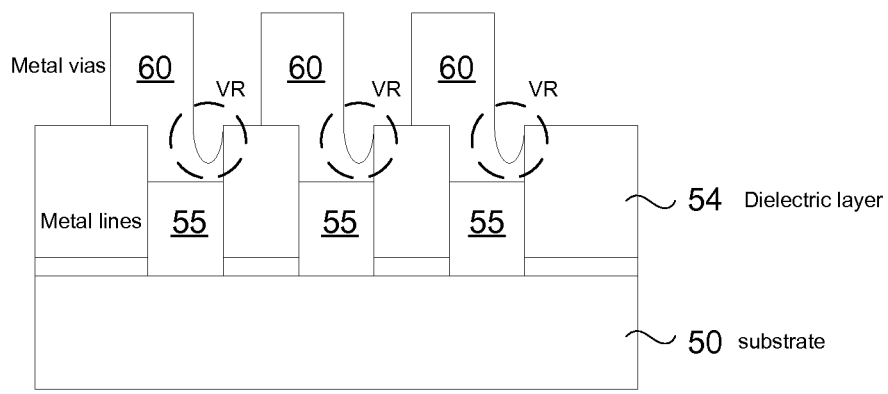
Figure 3:
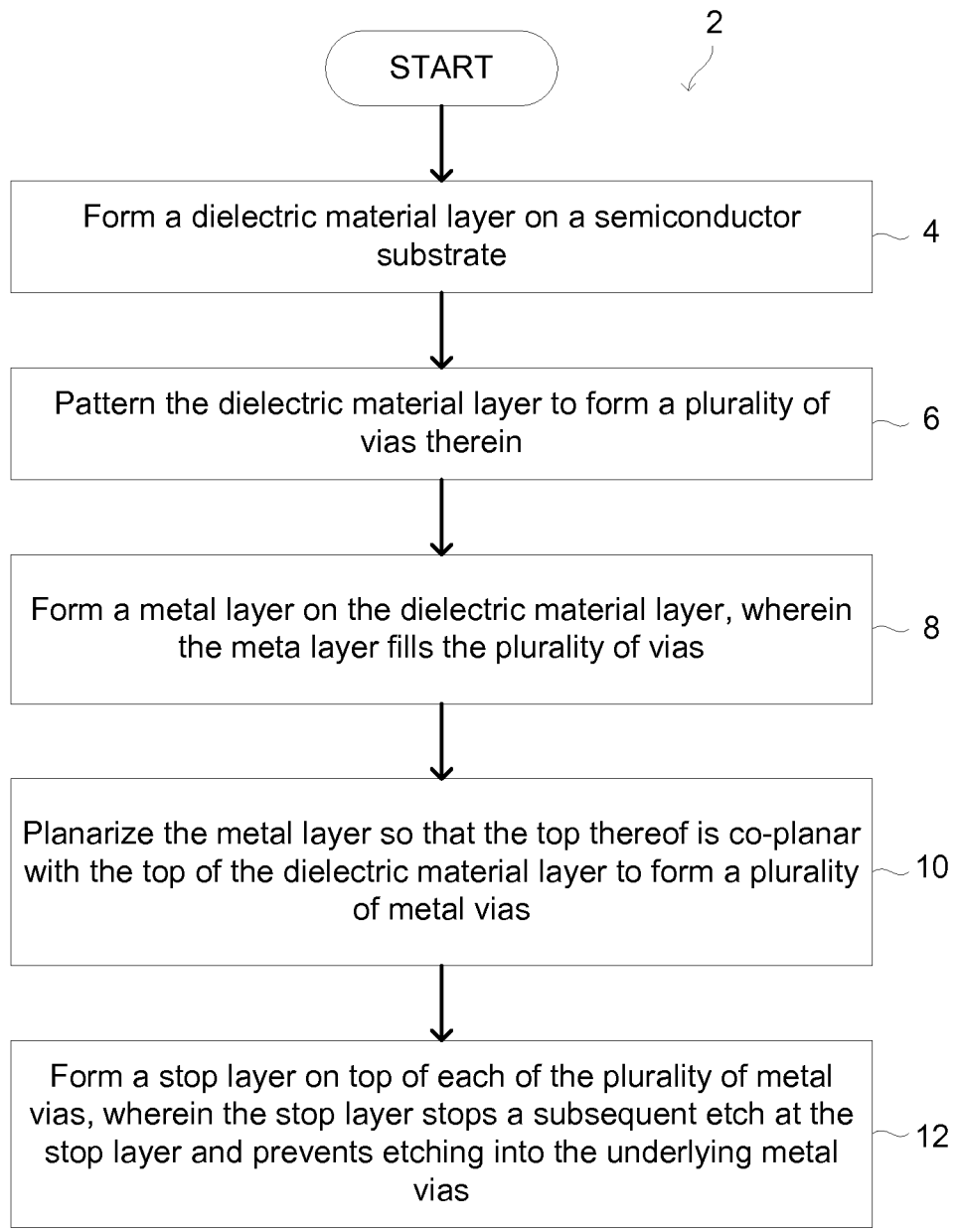
FIG. 3 is a flowchart of a method of fabricating an interconnect structure of a semiconductor device according to various embodiments of the present disclosure.

FIG. 3 is a flowchart of a method 2 for fabricating an interconnect structure of a semiconductor device according to various aspects of the present disclosure. Referring to FIG. 3, the method 2 includes block 4, in which a dielectric material layer is formed on a semiconductor substrate. The method 2 includes block 6, in which the dielectric material layer is patterned to form a plurality of vias therein. The method 2 includes block 8, in which a metal layer is formed on the dielectric material layer, wherein the metal layer fills the plurality of vias. The method 2 includes block 10, in which the metal layer is planarized so that the top of the metal layer is co-planar with the top of the dielectric material layer to form a plurality of metal vias. The method 2 includes block 12, in which a stop layer is formed on top of each of the plurality of metal vias, wherein the stop layer prevents a subsequent etch from etching the underlying metal vias.

It is understood that additional processes may be performed before, during, or after the blocks 4-12 shown in FIG. 3 to complete the fabrication of the interconnect structure, but these additional processes are not discussed herein in detail for the sake of simplicity.

FIGS. 4-10 are cross-sectional side views of a part of an interconnect structure at various fabrication stages according to embodiments of the method 2 of FIG. 3. It is understood that FIGS. 4-10 have been simplified for a better understanding of the inventive concepts of the present disclosure. It should be appreciated that the materials, geometries, dimensions, structures, and process parameters described herein are exemplary only, and are not intended to be, and should not be construed to be, limiting to the invention claimed herein. Many alternatives and modifications will be apparent to those skilled in the art, once informed by the present disclosure.

Figure 4:
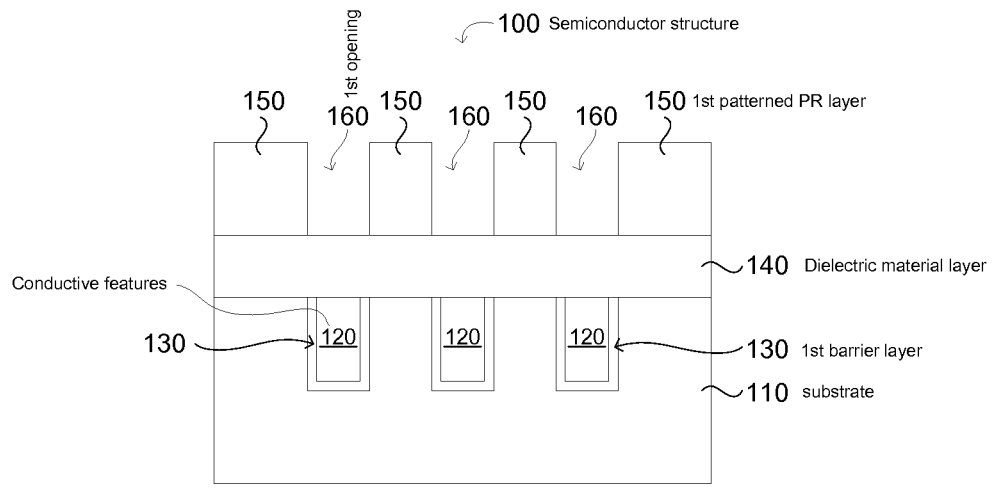
FIGS. 4-10 are cross-sectional side views of a part of an interconnect structure of a semiconductor device at various stages of fabrication in accordance with various embodiments of the present disclosure.

Referring to FIG. 4, a semiconductor structure 100 on a substrate 110 is provided. The semiconductor substrate 110 includes silicon. Alternatively or additionally, the substrate 110 may include other elementary semiconductor such as germanium. The substrate 110 may include a compound semiconductor such as silicon carbide, gallium arsenic, indium arsenide, and indium phosphide. The substrate 110 may include an alloy semiconductor such as silicon germanium, silicon germanium carbide, gallium arsenic phosphide, and gallium indium phosphide. In one embodiment, the substrate 110 includes an epitaxial layer. For example, the substrate may have an epitaxial layer overlying a bulk semiconductor. Furthermore, the substrate 110 may include a semiconductor-on-insulator (SOI) structure. For example, the substrate may include a buried oxide (BOX) layer formed by a process such as separation by implanted oxygen (SIMOX) or other suitable techniques, such as wafer bonding and grinding. The substrate 110 also includes various p-type doped regions and/or n-type doped regions, implemented by a process such as ion implantation and/or diffusion. Those doped regions include n-well, p-well, lightly doped region (LDD), heavily doped source and drain (S/D), and various channel doping profiles configured to form various integrated circuit (IC) devices, such as a complimentary metal-oxide-semiconductor field-effect transistor (CMOSFET), imaging sensor, and/or light emitting diode (LED). The substrate 110 may further include other functional features such as a resistor or a capacitor formed in and on the substrate. The substrate 110 further includes lateral isolation features provided to separate various devices formed in the substrate 110. In one embodiment, shallow trench isolation (STI) features are used for lateral isolation. The various IC devices may further include other features, such as silicide disposed on S/D and gate stacks overlying channels.

The semiconductor structure 100 may also include a plurality of dielectric layers and conductive features integrated to form an interconnect structure configured to couple the various p-type and n-type doped regions and the other functional features (such as gate electrodes), resulting in a functional integrated circuit. In one example, the semiconductor structure 100 may include a portion of the interconnect structure and is collectively referred to as the substrate 110. The semiconductor structure is further described later.

As noted above, the semiconductor structure 100 includes an interconnect structure. The interconnect structure includes a multi-layer interconnect (MLI) structure and an inter-level dielectric (ILD) integrated with the MLI structure, providing an electrical routing to couple various devices in the substrate 110 to the input/output power and signals. The interconnect structure includes various metal lines, contacts and via features (or via plugs). The metal lines provide horizontal electrical routing. The contacts provide vertical connection between silicon substrate and metal lines while via features provide vertical connection between metal lines in different metal layers.

Exemplary conductive features 120 are shown in FIG. 4 for illustration. In one embodiment, the conductive features 120 include a portion of the interconnect structure. For example, the conductive features 120 include a contact, a metal via, or a metal line. In this case, the conductive features 120 may be further surrounded by a first barrier layer 130 to prevent diffusion and/or provide material adhesion. The conductive features 120 may include aluminum (Al), copper (Cu) or tungsten (W). The first barrier layer 130 may include titanium nitride (TiN), tantalum nitride (TaN), tungsten nitride (WN), titanium silicon nitride (TiSiN) or tantalum silicon nitride (TaSiN). The conductive features 120 and the first barrier layer 130 may be formed by a procedure including lithography, etching and deposition. In another embodiment, the conductive features 120 include an electrode of a capacitor, a resistor or a portion of a resistor. Alternatively, the conductive features 120 include a doped region (such as a source or a drain), or a gate electrode. In another example, the conductive features 120 are silicide features disposed on respective source, drain or gate electrode. The silicide feature may be formed by a self-aligned silicide (salicide) technique.

Referring still to FIG. 4, a dielectric material layer 140 is formed on the substrate 110 and the conductive features 120. The dielectric material layer 140 may include one dielectric material layer, such as silicon oxide, silicon nitride, a dielectric material layer having a dielectric constant (k) lower than thermal silicon oxide (thereafter referred to as low-k dielectric material layer), or some other suitable dielectric material layer. In various examples, the low k dielectric material may include fluorinated silica glass (FSG), carbon doped silicon oxide, Xerogel, Aerogel, amorphous fluorinated carbon, Parylene, BCB (bis-benzocyclobutenes), SiLK (Dow Chemical, Midland, Mich.), polyimide, and/or other materials as examples. In another example, the low k dielectric material may include an extreme low k dielectric material (XLK). In another example, the low k dielectric material layer includes a porous version of an existing Dow Corning dielectric material called FOX (flowable oxide) which is based on hydrogen silsesquioxane. A process of forming the dielectric material layer 140 may utilize spin-on coating or chemical vapor deposition (CVD). In one example, a chemical mechanical polishing (CMP) process may be used to further planarize the top surface of the dielectric material layer 140.

As illustrated in FIG. 4, a first patterned photoresist layer 150 is formed on the dielectric material layer 140. The first patterned photoresist layer 150 includes various first openings 160 that define portions of the dielectric material layer 140 for vias and expose those portions for subsequent etch. Particularly, the first openings 160 are aligned with respective conductive features 120. In one embodiment, the first patterned photoresist layer 150 is formed by a procedure including coating, exposure, post exposure baking, and developing. Particularly, the resist coating may utilize spin-on coating. In one example of the exposure, the coated resist layer is selectively exposed by radiation beam through a mask having a predefined pattern. The radiation beam includes ultraviolet (UV) light in one example. The exposing process may be further extended to include other technologies such as a maskless exposing or writing process. After the exposing process, the first photoresist layer 150 is further processed by a thermal baking process, referred to as a post exposure bake (PEB). The PEB may induce a cascade of chemical transformations in the exposed portion of the resist layer, which is transformed to have an increased solubility of the resist in a developer. Thereafter, the resist layer on the substrate is developed such that the exposed resist portion is dissolved and washed away during the developing process. Thus the resist layer is patterned to have one or more first openings 160 as illustrated in FIG. 4. The lithography processes described above may only present a subset of processing steps associated with a lithography patterning technique. The lithography process may further include other steps such as cleaning and baking in a proper sequence. For example, the developed resist layer may be further baked, referred as hard baking.

Figure 5:
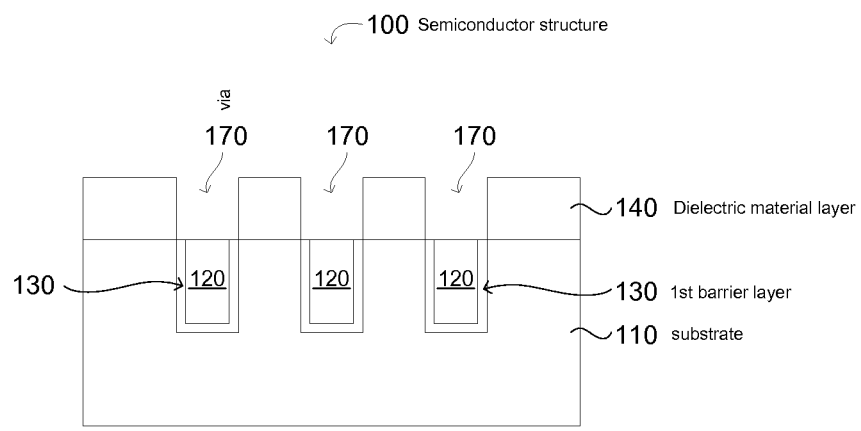

As illustrated in FIG. 5, the dielectric material layer 140 is etched through the first openings 160 of the first patterned photoresist layer 150 using the first patterned photoresist layer 150 as an etch mask, resulting in one or more vias 170 in the dielectric material layer 140 such that the respective conductive features 120 are at least partially exposed within the vias 170. The dielectric material layer 140 exposed within the first openings 160 of the first patterned photoresist layer 150 is removed by an etch technique such as dry etch, wet etch, or combinations thereof. In one example, the etch process utilizes a medium-density plasma etch system using capacitively coupled plasmas, or a high-density plasma etch system that utilizes either inductive, helicon, or electron cyclotron resonance (ECR) plasmas, wherein the exposed dielectric material is anisotropically removed by fluorocarbon plasma, forming the vias 170, as illustrated in FIG. 5. Other dry-etch process may be alternatively used. The mechanism of etching in each dry-etch process may have a physical basis (e.g., glow-discharge sputtering, or ion milling) or a chemical basis (e.g., in pure plasma etching) or a combination of both (e.g., reactive ion etching or RIE). Sputtering relies on directional nature of the incident energetic ions to etch in a highly anisotropic manner. Pure plasma etching, a chemical basis etching, may achieve a very high selectivity against both mask material and underlying layers and typically etch in an anisotropic fashion. By combining both physical and chemical mechanism etch offers a controlled anisotropic etch with adequate selectivity. Thereafter, the first patterned photoresist layer 150 may be removed by a process such as wet stripping or O2 plasma ashing. In another alternative embodiment, an etch stop layer is disposed between the substrate 110 and the dielectric material layer 140 and the etch process includes a dry etch to etch through the dielectric material layer 140 and stops at the etch stop layer. The etch process may further include a wet etch to remove the etch stop layer within the vias 170. In another example, a hard mask may be utilized as an etch mask during the etch process to pattern the dielectric material layer 140.

Figure 6:
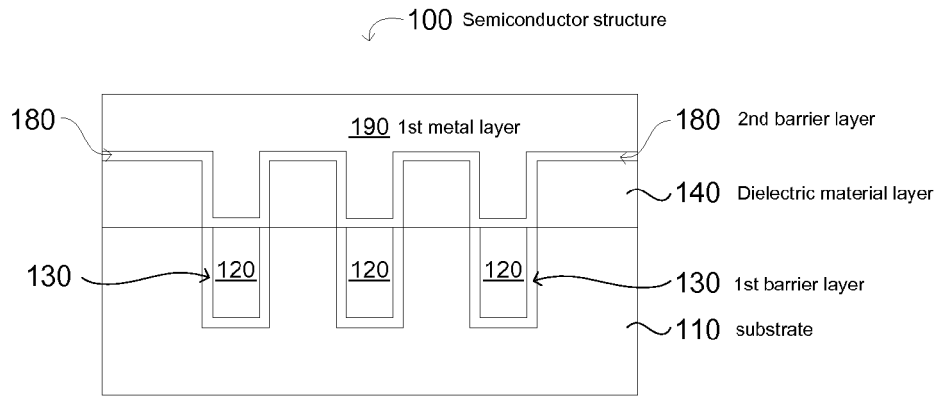

Referring now to FIG. 6, a second barrier layer 180 is formed in the vias 170, as well as on the top of the dielectric material layer 140. In one embodiment, the second barrier layer 180 includes metal and is electrically conductive but does not permit inter-diffusion and reactions between the dielectric material layer 140 and a metal layer to be filled in the vias 170. The second barrier layer 180 may include refractory metals and their nitrides. In various examples, the second barrier layer 180 includes TiN, TaN, Co, WN, TiSiN, TaSiN, or combinations thereof. The second barrier layer 180 may include multiple films. For example, Ti and TiN films are used as the second barrier layer. The second barrier layer 180 may be deposited by physical vapor deposition (PVD), chemical vapor deposition (CVD), metal-organic chemical vapor deposition (MOCVD), and atomic layer deposition (ALD), or other suitable techniques.

Still referring to FIG. 6, a first metal layer 190 is formed on the second barrier layer 180. The first metal layer 190 fills in the vias 170 and further disposed over the dielectric material layer 140. The first metal layer 190 may include copper (Cu), aluminum (Al), tungsten (W), or other suitable conductive materials. In an exemplary embodiment with enhanced etch effect, the metal layer includes copper or copper alloy, such as copper magnesium (CuMn), copper aluminum (CuAl), copper silicon (CuSi), copper manganese (CuMn), copper titanium (CuTi), copper tungsten (CuW), copper tantalum (CuTa), copper zirconium (CuZr), or copper molybdenum (CuMo). In furtherance of the exemplary embodiment, the Mn concentration of the copper magnesium alloy ranges between about 0.5% and about 2% in weight. In one embodiment, the first metal layer 190 includes a copper layer deposited by PVD. In one embodiment, the first meal layer 190 includes a copper seed layer deposited by PVD and bulk copper layer by plating. In various other examples, copper deposition may be implemented by other techniques, such as PVD, CVD, MOCVD, or plating. A copper reflow process may be added to enhance the copper filling profile.

Figure 7:
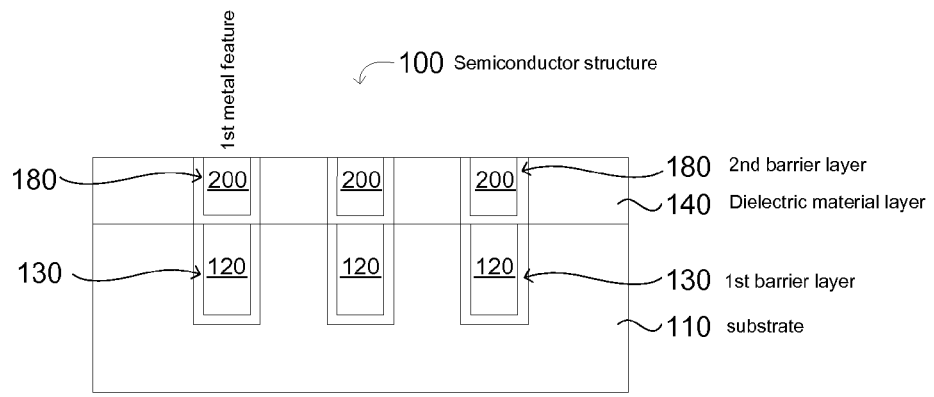

The first metal layer 190 is planarized by a chemical mechanical polishing (CMP) or an etch back step, for example so that the top of the first metal layer 190 is substantially co-planar with the top of the dielectric material layer 140 resulting in a plurality of first metal features 200 in the vias 170, as illustrated in FIG. 7. In one embodiment when the underlying conductive features 120 are metal lines, the first metal features 200 are also referred to as metal vias, via features, or vias to provide vertical electrical routing between metal lines. In an alternative embodiment, when the underlying conductive features 120 are source/drain features and/or gate electrodes, the first metal features 200 in the vias 170 are also referred to as metal contact, contact features or contacts to provide electrical routing between metal lines and the semiconductor substrate 110.

Figure 8:
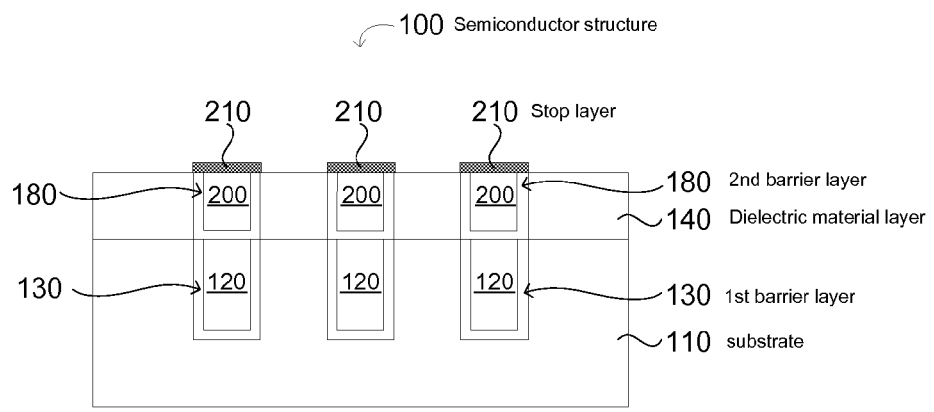

In an aspect of the present disclosure, a stop layer 210 is formed on the first metal features 200, the dielectric material layer 140 and/or the second barrier layer 180, as shown in FIG. 8. In one embodiment, the stop layer 210 includes metal and is electrically conductive. In some embodiments, the stop layer 210 includes refractory metals and their nitrides. In various embodiments, the stop layer 210 includes tantalum (Ta), tantalum nitride (TaN), tantalum silicon nitride (TaSiN), tungsten (W), tungsten nitrogen (WN), ruthenium (Ru), cobalt (Co), cobalt tungsten (CoW), cobalt tungsten phosphorus (CoWP), titanium (Ti), titanium nitrogen (TiN), titanium silicon nitrogen (TiSiN), cobalt (C), or combinations thereof. The stop layer 210 may include multiple films. The stop layer 210 may be deposited by chemical vapor deposition (CVD), physical vapor deposition (PVD), organic chemical vapor deposition (MOCVD), atomic layer deposition (ALD), or other suitable techniques. In one embodiment, the stop layer 210 has a thickness from about 10 Angstroms to about 100 Angstroms.

In a later step, the stop layer 210 is patterned and etched to form a stop layer 210 on top of each of the plurality of first metal features 200. In a later etch process to form a metal feature, the stop layer 210 prevents etching into the underlying first metal features 200 and the formation of recesses therein. The method for patterning the stop layer 210 includes a lithography process and etching, as they are understood by those skilled in the art. In the lithography process, a patterned photoresist layer is formed on the stop layer 210 as an etch mask having various openings that exposes the regions of the stop layer 210 to be removed. The lithography technique to form the patterned photoresist layer is similar to the method discussed above for forming the first patterned photoresist layer 150.

In another embodiment of the present disclosure, a self assembly monolayer (SAM) is deposited on top of each of the plurality of first metal features 200 prior to the forming of the stop layers 210. The SAM is a short carbon chain structure. In an exemplary embodiment, the SAM structure has around 2 to 10 units carbon and two different functional groups on two sides. One side has, as an example a Si—OH functional group that bonds with the conductive metals, such as copper in the first metal features 200, and the other side has, as an example a —NH2 functional group that bonds to the elements such as Ta, W, Co, Ti found in the stop layer 210. The SAM may be deposited via spin-on coating from a solution containing solvents such as, for example hexane and SAM monomer and in one embodiment is deposited to a thickness from about 5 Angstroms to about 20 Angstroms. Yes, the SAM is deposited by spin on coating and thereafter patterned.

Still referring to FIG. 8, in yet another embodiment, the stop layer 210 is formed by copper alloy segregation to the surface. Subjecting the semiconductor device 100 to an anneal process, metal elements as well as metal oxide (if oxygen element present) providing a good etch stop layer will segregate to the surface of the first metal features 200. According to an exemplary embodiment, metal elements such as, for example Mn, Al, Mg, Ta, Zr, Ti, W, Mo segregate to the copper free surface of the metal features 200 when the semiconductor device 100 undergoes a thermal anneal at a temperature in the range from about 100 C to about 400 C, at a pressure of about 1 Torr to about 760 Torr in a gas such as, for example N2, N2/H2, N2/O2, Ar.

Figure 9:
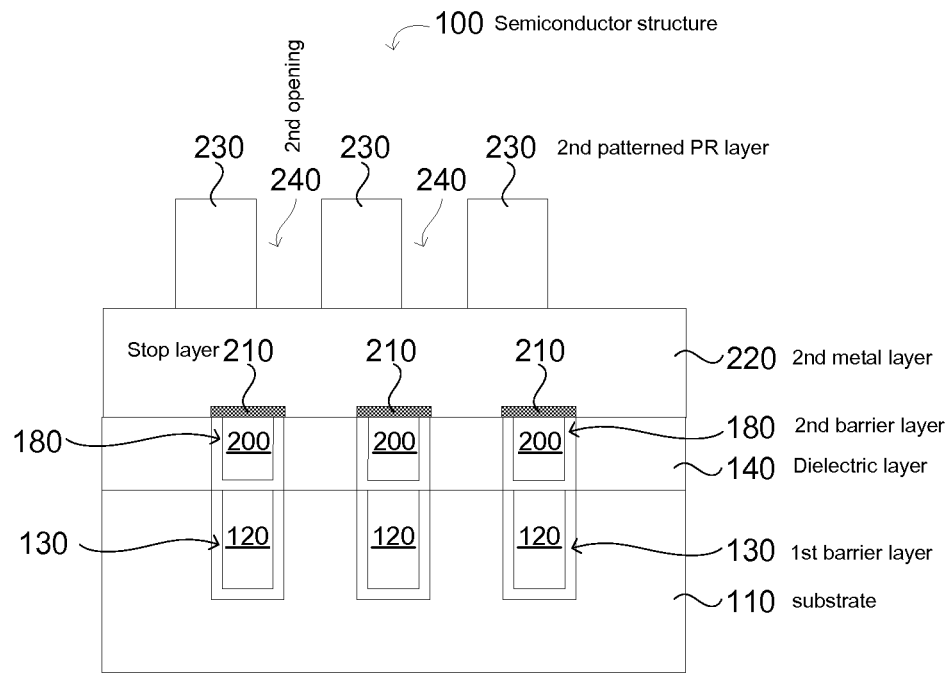

With reference now to FIG. 9, a second metal layer 220 on the dielectric material layer 140 and the stop layers 210. The second metal layer 220 may include copper (Cu), aluminum (Al), tungsten (W), or other suitable conductive materials. In an exemplary embodiment with enhanced etch effect, the metal layer includes copper or copper alloy, such as copper magnesium (CuMn), copper aluminum (CuAl), copper silicon (CuSi), copper manganese (CuMn), copper titanium (CuTi), copper tungsten (CuW), copper tantalum (CuTa), copper zirconium (CuZr), or copper molybdenum (CuMo). In furtherance of the exemplary embodiment, the Mn concentration of the copper magnesium alloy ranges between about 0.5% and about 2% in weight. In one embodiment, the second metal layer 220 includes a copper layer deposited by PVD. In one embodiment, the second meal layer 220 includes a copper seed layer deposited by PVD and bulk copper layer by plating. In various other examples, copper deposition may be implemented by other techniques, such as PVD, CVD, MOCVD, or plating. A copper reflow process may be added to enhance the copper filling profile.

A second patterned photoresist layer 230 having second openings 240 is formed on the second metal layer 220. The lithography technique to form the second patterned photoresist layer 230 is similar to the method discussed above for forming the first patterned photoresist layer 150 and so will not be described again. The second patterned photoresist layer 230 is formed on the second metal layer 220 as an etch mask having second openings 240 that exposes the regions of the second metal layer 220 to be removed.

The metal etch process is implemented using plasma etch, in one embodiment. Usually, copper is considered to be difficult to etch in plasma etching processes due to it forming an etch product with chlorine-CuCl, which is relatively nonvolatile below a certain temperature range. Thus copper may not be plasma etched with any one of the etchant gases containing chlorine. Therefore, copper etch may not be achieved by a traditional subtractive etching approach used to form aluminum metal lines. So, to overcome the nonvolatile copper compound issue and apply an appropriate gas combination have become challenging tasks for copper plasma etch. In one embodiment, the etch gas includes carbon, hydrogen, oxygen and nitrogen. In another embodiment, the copper etch gas applied to copper plasma etch includes a hydrogen containing gas, such as $C_xH_y$, $C_xF_y$, $C_xH_yF_z$, or combinations thereof. The subscript x, y, or z has a value greater than 0 and less than 6. The subscripts x, y, and z may be omitted for simplicity in the following description. In this embodiment, the copper etch gas applied in Cu plasma etch further includes at least one of CO and O2, and at least one of N2 and Ar. In a particular example, the gas flows for the hydrogen containing gas ranges between about 1 sccm and about 100 sccm; the gas flow of CO (or O2) ranges between about 1 sccm and about 500 sccm; and the gas flow of N2 (or Ar) ranges between about 1 sccm and about 1000 sccm. In furtherance of the present example, the plasma etch temperature (substrate temperature) is within a range of about 20 C and about 250 C. In another example, the plasma etch temperature is within a range of about 20 C and about 80 C. Experiments have been conducted that show that the CuMn alloy has a higher etch rate. Some of these experiments further show that the etch rate is about 1.5 to 3 times of the etch rate of the copper metal layer without magnesium content.

The method to pattern the second metal layer 220 is described above, and other embodiments are present. In one embodiment, a wet etch process may be alternatively or additionally used to pattern the second metal layer 220. In yet another embodiment, when the second metal layer 220 includes other suitable metal, such as aluminum or tungsten, other etch gas may be used. In yet another embodiment, a hard mask, such as silicon oxide, silicon carbide, silicon nitride, titanium nitride, or tantalum nitride may be formed as an etch mask by a procedure including lithography and etching.

Figure 10:
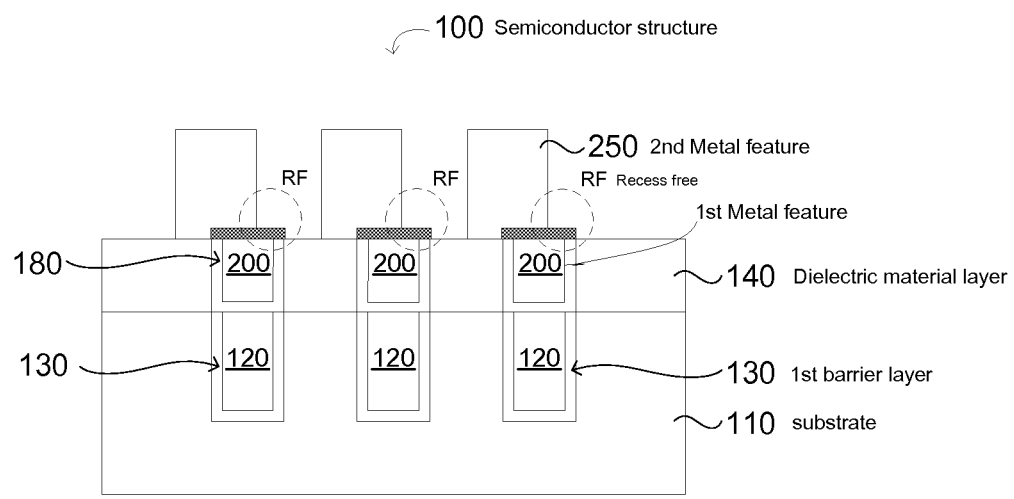

The second metal layer 220 is etched such that portions thereof above the dielectric material layer 140 are patterned to form a plurality of second metal features 250. Second metal features 250 may be metal lines, metal vias, or via features to provide vertical electrical routing between metal lines, in one embodiment. In one embodiment, each of the second metal features 250 is substantially aligned with a respective one of the plurality of first metal features. The etching stops at the stop layers 210 and does not etch into the underlying first metal features 200, thus avoiding undesirable recesses. Even in the embodiment as shown in FIG. 10, where the second metal features 200 are in contact with the underlying first metal features 200 but due to misalignment offset a bit (e.g., shifted to one side) relative to the first metal features 200, the stop layers 210 prevents the underlying first metal features 200 from being etched, resulting in a recess free (RF) semiconductor structure 100.

The present disclosure has described various exemplary embodiments. According to one embodiment, a method for forming an interconnect structure includes forming a dielectric material layer on a semiconductor substrate. The dielectric material layer is patterned to form a plurality of vias therein. A first metal layer is formed on the dielectric material layer, wherein the first metal layer fills the plurality of vias. The first metal layer is planarized so that the top thereof is substantially co-planar with the top of the dielectric material layer to form a plurality of first metal features. A stop layer is formed on top of each of the plurality of first metal features, wherein the stop layer stops a subsequent etch from etching into the plurality of the first metal features. The stop layer covers and is substantially aligned with each of the plurality of first metal features and not extending substantially over the dielectric material between the plurality of first metal features. By not extending substantially, it is meant that the etch stop layer is nominally and effectively co-teminus and aligned with respective ones of the first metal features, but that due to process variations, and the like, some de minimus amounts of etch stop layer might extend slightly over the dielectric material.

According to another embodiment, a method for forming an interconnect structure includes forming a plurality of metal vias in a dielectric material layer on a semiconductor substrate. A stop layer is formed on top of each of the plurality of metal vias, the stop layer for stopping the underlying metal vias from being etched in a subsequent etch process. A copper-containing layer is formed on the stop layers and the dielectric material layer. A patterned hard mask layer is formed on the copper-containing layer, wherein the patterned hard mask layer has a plurality of openings. The copper-containing layer is etched to form a plurality of copper lines. Each of the copper lines are offset from a respective one of the plurality of underlying metal vias, and the stop layers prevent etching into the underlying metal vias.

According to yet another embodiment, a semiconductor structure includes a dielectric material layer disposed on a semiconductor substrate. A plurality of metal features are embedded in the dielectric material layer. A barrier layer is interposed between the dielectric material layer and on the bottom and sidewalls of each of the metal features. A stop layer is formed on the top of each of the metal features for stopping a subsequent etch from etching into the underlying metal features.

In the preceding detailed description, specific exemplary embodiments have been described. It will, however, be apparent to a person of ordinary skill in the art that various modifications, structures, processes, and changes may be made thereto without departing from the broader spirit and scope of the present disclosure. The specification and drawings are, accordingly, to be regarded as illustrative and not restrictive. It is understood that embodiments of the present disclosure are capable of using various other combinations and environments and are capable of changes or modifications within the scope of the claims.

What is claimed is:
1. A method, comprising:
   forming a dielectric material layer on a semiconductor substrate;
   patterning the dielectric material layer to form a plurality of vias therein;
   forming a first metal layer on the dielectric material layer, wherein the first metal layer fills the plurality of vias;
   planarizing the first metal layer so that the top thereof is substantially co-planar with the top of the dielectric material layer to form a plurality of first metal features; and
   annealing the plurality of first metal features to form a discontinuous stop layer on top of each of the plurality of first metal features, the stop layer covering and being substantially aligned with each of the plurality of first metal features and not extending substantially over the dielectric material between the plurality of first metal features, wherein the plurality of first metal features comprises a first conductive material and a second conductive material, the second conductive material being smaller in concentration than the first conductive material, and wherein the annealing the plurality of first metal features comprises segregating the second conductive material to the top of each of the plurality of the first metal features to form the discontinuous stop layer.

2. The method of claim 1, wherein the first conductive material comprises copper, and wherein the forming the first metal layer includes forming a copper-containing material selected from the group consisting of copper (Cu), copper magnesium (CuMn), copper aluminum (CuAl), copper manganese (CuMn), copper titanium (CuTi), copper silicon (CuSi), copper tungsten (CuW), copper tantalum (CuTa), copper zirconium (CuZr), copper molybdenum (CuMo), and combinations thereof.

3. The method of claim 1, wherein the first metal features comprise metal vias.

4. The method of claim 1, wherein the forming the stop layer includes forming a material selected from the group consisting of tantalum (Ta), tantalum nitride (TaN), tantalum silicon nitride (TaSiN), tungsten (W), tungsten nitrogen (WN), ruthenium (Ru), cobalt (Co), cobalt tungsten (CoW), cobalt tungsten phosphorus (CoWP), titanium (Ti), titanium nitrogen (TiN), titanium silicon nitrogen (TiSiN), cobalt (C), and combinations thereof.

5. The method of claim 1, further comprising:
   depositing a self assembly monolayer (SAM) on the top of each of the plurality of first metal features prior to the forming of the stop layers.

6. The method of claim 1, further comprising:
   forming a barrier layer in the plurality of vias and on the dielectric material layer prior to the forming of the first metal layer.

7. The method of claim 1, further comprising:
   forming a second metal layer on the dielectric material layer and the stop layers; and
   etching the second metal layer such that portions of the second metal layer above the dielectric material layer are patterned to form a plurality of second metal features, wherein each of the plurality of second metal features is substantially aligned with a respective one of the plurality of first metal features, and further wherein the etching stops at the stop layers and does not etch into the plurality of first metal features.

8. The method of claim 1, wherein the annealing the plurality of first metal features comprises a thermal anneal process at a temperature in a range from about 100 degrees Celsius to about 400 degrees Celsius.

9. A method, comprising:
   forming a plurality of metal vias in a dielectric material layer on a semiconductor substrate;
   forming a stop layer on top of each of the plurality of metal vias, the stop layer for stopping the underlying metal vias from being etched in a subsequent etching process;
   forming a copper-containing layer on the stop layers and the dielectric material layer;
   forming a patterned hard mask layer on the copper-containing layer, wherein the patterned hard mask layer has a plurality of openings; and
   etching the copper-containing layer to form a plurality of copper lines, wherein the etching stops at the stop layers and does not etch into the underlying metal vias.

10. The method of claim 9, wherein a barrier layer is formed on the bottom and sidewalls of the metal vias in the dielectric material layer.

11. The method of claim 9, wherein the forming the copper-containing layer includes forming a copper-containing material selected from the group consisting of copper (Cu), copper magnesium (CuMn), copper aluminum (CuAl), copper manganese (CuMn), copper titanium (CuTi), copper silicon (CuSi), copper tungsten (CuW), copper tantalum (CuTa), copper zirconium (CuZr), copper molybdenum (CuMo), and combinations thereof.

12. The method of claim 9, wherein the forming the stop layer includes forming a material selected from the group consisting of tantalum (Ta), tantalum nitride (TaN), tantalum silicon nitride (TaSiN), tungsten (W), tungsten nitrogen (WN), ruthenium (Ru), cobalt (Co), cobalt tungsten (CoW), cobalt tungsten phosphorus (CoWP), titanium (Ti), titanium nitrogen (TiN), titanium silicon nitrogen (TiSiN), cobalt (C), and combinations thereof.

13. The method of claim 9, wherein the stop layer is formed from a process selected from the group consisting of chemical vapor deposition (CVD), physical vapor deposition (PVD), organic chemical vapor deposition (MOCVD), and atomic layer deposition (ALD).

14. The method of claim 9, further comprising:
depositing a self assembly monolayer (SAM) on the top of each of the plurality of metal vias prior to the forming of the stop layers.

* * * * *